United States Patent
Soundarapandian et al.

(10) Patent No.: US 6,611,221 B1
(45) Date of Patent: Aug. 26, 2003

(54) MULTI-BIT SIGMA-DELTA MODULATOR EMPLOYING DYNAMIC ELEMENT MATCHING USING ADAPTIVELY RANDOMIZED DATA-WEIGHTED AVERAGING

(75) Inventors: Karthikeyan Soundarapandian, Dallas, TX (US); James R. Hochschild, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/259,125

(22) Filed: Sep. 27, 2002

Related U.S. Application Data (60) Provisional application No. 60/405,898, filed on Aug. 26, 2002.

(51) Int. Cl.⁷ .................................................. H03M 3/00
(52) U.S. Cl. ...................................... 341/143; 375/252
(58) Field of Search .................................. 341/143, 118, 341/120, 155

(56) References Cited

U.S. PATENT DOCUMENTS

| | | | |
|---|---|---|---|
| 6,124,813 A | 9/2000 | Robertson et al. | |
| 6,218,977 B1 | 4/2001 | Friend et al. | |
| 6,304,608 B1 * | 10/2001 | Chen et al. | 375/252 |
| 6,426,714 B1 | 7/2002 | Ruha et al. | |

OTHER PUBLICATIONS

Todd L. Brooks, David H. Robertson, Daniel F. Kelly, Anthony Del Muron, and Stephen W. Hartson, "A Cascaded Sigma–Delta Pipeline A/D Converter with 1.25 MHz Signal Bandwidth and 89 dB SNR," IEE Journal of solide–State Circuits, Dec. 1997, pp. 1896–1906, vol. 32, No. 12.

Ichiro Fujimori, Lorenzo Longo, Armond Hairapetian, Kazushi Seiyama, Steve Kosic, Jun Cao and Shu–Lap Chan, "A 90–dB SNR 2.5–MHz Output–Rate ADC Using Cascaded Multibit Delta–Sigma Modulation at 8x Oversampling Ration," IEEE Journal of Solid–State Circuits, Dec. 2000, pp. 1820–1828, vol. 35, No. 12.

Kuan–Dar Chen and Tai–Haur Kuo, "An Improved Technique for Reducing Baseband Tones in Sigma–Delta Modulators Emloying Data Weighted Averaging Algorithm Without Adding Dither," IEEE Transactions on Circuits and Systems–II: Analog and Digital Signal Processing, Jan. 1999, pp. 63–68, vol. 46, No. 1.

Morteza Vadipour, "Techniques for Preventing Tonal Behavior of Data Weighted Averaging Algorithm in Sigma–Delta Modulators," IEEE Transactions on Circuits and Systems–II: Analog and Digital Signal Processing, Nov. 2000, pp. 1137–1144, vol. 47, No. 11.

* cited by examiner

*Primary Examiner*—Peguy Jeanpierre
*Assistant Examiner*—Joseph Lauture
(74) *Attorney, Agent, or Firm*—April M. Mosby; Wade James Brady, III; Frederick J. Telecky, Jr.

(57) ABSTRACT

A sigma-delta modulator disclosed herein provides a first order noise shaping of the errors associated with the multi bit DAC employing unit elements, without creating large in-band tones. The sigma-delta modulator includes a multi-bit ADC connected to receive a processed signal from a filter that performs first order noise shaping. Additionally, a feedback path, leading from the multi-bit ADC to a summer, includes at least one dynamic element matching algorithm logic block connected to a multi-bit DAC having a plurality of unit elements. The dynamic element matching algorithm logic block alternately generates a consecutive increment shift signal and a random shift signal at a predetermined or a random time interval for shifting the digital feedback signal by a random amount depending upon the amplitude and frequency of the analog input signal to provide a randomized rotated output to the DAC. Thereby, the feedback path minimizes mismatch error associated with the plurality of unit elements within the multi-bit DAC to provide an sigma-delta modulator having substantially reduced the in-band tones for all signal amplitudes without trading off the peak SNRD resulting from data weighted averaging.

20 Claims, 5 Drawing Sheets

SFDR = 123.9dB @ OSR=8
SNRD = 103.5dB @ OSR=8
Rbit = 16.89 bits @ OSR=8

FIG. 2b
(PRIOR ART)

SFDR = 78.5dB @ OSR=8
SNRD = 75.1dB @ OSR=8
Rbit = 12.19 bits @ OSR=8

SFDR = 106.0dB @ OSR=8
SNRD = 91.9dB @ OSR=8
Rbit = 14.98 bits @ OSR=8

FIG. 4a
(PRIOR ART)

SFDR = 75.0dB @ OSR=8
SNRD = 68.5dB @ OSR=8
Rbit = 11.09 bits @ OSR=8

MULTI-BIT SIGMA-DELTA MODULATOR EMPLOYING DYNAMIC ELEMENT MATCHING USING ADAPTIVELY RANDOMIZED DATA-WEIGHTED AVERAGING

This application claims benefit of provisional application No. 60/405,898 filed Aug. 26, 2002.

FIELD OF THE INVENTION

The present invention relates to multi-bit sigma-delta analog-to-digital converter and, more particularly, to a multi-bit sigma-delta analog-to-digital converter having an adaptively randomizable data weighted averaging algorithm dynamic element matching logic block.

BACKGROUND OF THE INVENTION

Conversion of analog signals to digital signals and vice versa interfaces real world systems with digital systems that read, store, interpret, manipulate and otherwise process the discrete values of sampled analog signals, many of which vary. Real world applications that convert digital signals to analog waveforms at a high resolution include systems such as, digital audio systems such as compact disc players, digital video players, and various other high performance audio applications.

Sigma-delta modulators (SDMs) have come into widespread use as a processing solution regarding these real world digital audio applications to provide a high resolution data conversion solution using low resolution building blocks. A low resolution building block, such as the single-bit DAC, provides perfect linearity which the single-bit SDM relies upon to achieve high resolution. In addition, the single-bit SDM has low sensitivity to analog component matching and large over-sampling ratios (OSRs), making it the preferred architecture for the past decade. These large OSRs arise from the inherent linearity of the single-bit DAC and the extremely small input bandwidth. To obtain higher resolution or wider bandwidth, however, higher order loops are required. Higher order loops, however, cause instability problems, resulting in reduced input range.

Figure 1:
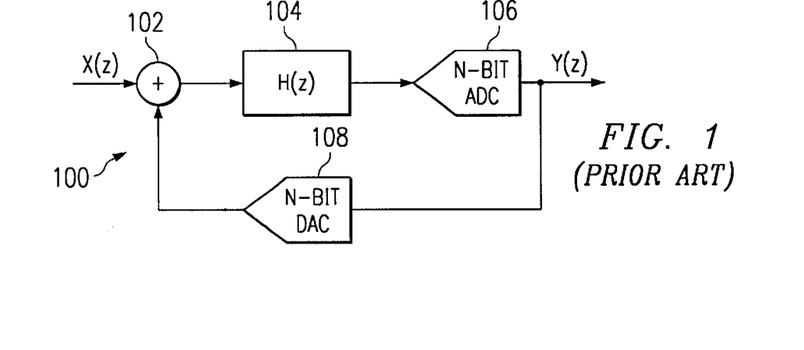
FIG. 1 illustrates a known multi-bit sigma-delta modulator (SDM)

Multi-bit, multi-stage SDMs (MASH) relax the instability problem and require lower oversampling ratios (OSRs). The MASH architecture can provide a signal to quantization noise ratio (SQNR) greater than 16 bits even with OSRs as low as 8. The first stage of a conventional MASH architecture, as shown in FIG. 1, includes an n-bit ADC and an n-bit DAC in its feedback path. Generally, the ADC and DAC within the MASH architecture include discrete data elements, such as, capacitors, resistors, current sources and the like for converting electrical signals from analog to digital form and vice versa. Particularly, the DAC includes a bank of capacitors configured such that a selected number of capacitors release their electrical energy into a summing junction that produces an analog output signal equivalent to the digital input. Conversely, the ADC includes comparators combined with a voltage divider network such that each comparator compares the same reference voltage to an incrementally higher voltage level associated with the incoming analog signal. A common clock triggers the output of the comparators, such that each comparator generates a high logic (1) or a low logic (0) level with the parallel output of the comparators representing a digital "thermometer code" indicative of the incoming analog voltage level. This thermometer code may then be digitally processed to generate an n-bit digital word representing the converted analog signal.

Since some degree of variation exists among identically modeled elements due to manufacturing variations, imperfections in materials used, change in temperature, humidity, degradation, etc., noise results. In particular, any mismatch in the unit elements of the DAC causes non-linearity in the feedback path, which manifests itself as distortion as well as noise at the output. Thus, the major disadvantage of the MASH architecture is that the multi-bit DAC in the feedback path does not possess the inherent linearity of the single-bit DAC and, thus, produces distortion in the signal path.

Figure 2A:
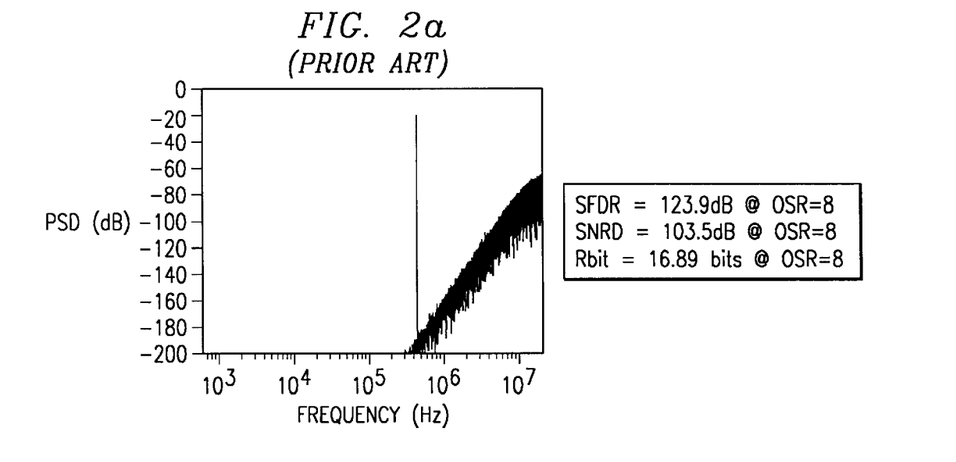
FIGS. 2a and 2b display the frequency spectrum of the output of a multi-bit SDM having unit element mismatch of 0% and 0.1%, respectively.
Figure 2B:
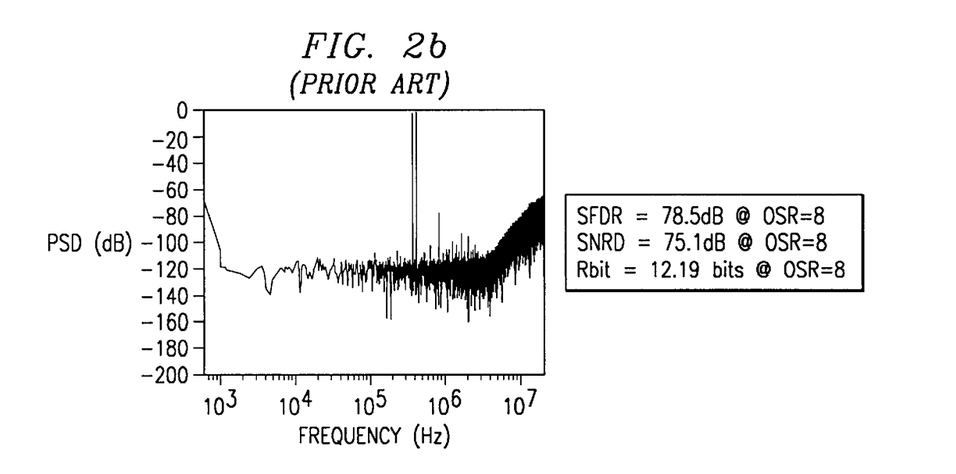

Though component mismatches down to 0.1% can be achieved with known technologies, this is not sufficient to achieve specifications above 100 dB spurious free dynamic range (SFDR). The problem is more severe for high speed modulators having low OSRs. FIGS. 2a and 2b illustrate the frequency spectrum at the output of a typical 2-1-1 multistage SDM having a 3-bit DAC in the first stage, where the input bandwidth is 2.5 MHz and the OSR is eight. FIG. 2a displays the modulator output where the unit elements have a mismatch of 0% and FIG. 2b displays the modulator output where the unit elements have a mismatch of 0.1%. As implied by FIG. 2b, even a small mismatch in the unit elements can increase the noise floor and the tones substantially, thereby reducing both the signal-to-noise ratio plus distortion (SNRD) and SFDR, substantially.

There are several approaches to correct the effects of unit element mismatch. The first approach incorporates trimming the unit elements to cancel the noise at the output. Trimming, however, is expensive and hence is not suited for a low cost semiconductor environment. Another approach incorporates calibration or error correction associated with all unit elements within the SDM. This second approach, however, is very complex to implement and attempts towards commercial use have not been successful to date. The last known approach implements shaping the spectrum of DAC mismatch through the use of dynamic element matching (DEM) algorithms which algorithmically manipulate the selection of the data converter unit elements to provide a noise shaping of the mismatch errors associated with these elements.

Figure 3A:
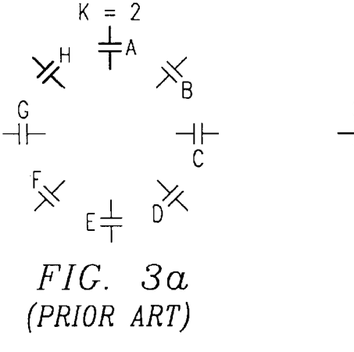
FIGS. 3a, 3b, and 3c show the multi-bit DAC unit element configuration for a 2, 4, 6 input sequence, respectively.
Figure 3B:
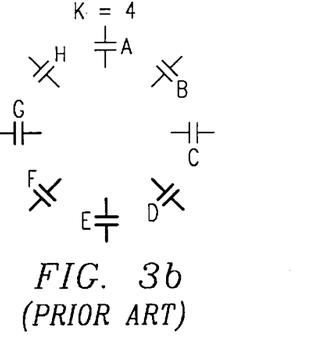
Figure 3C:
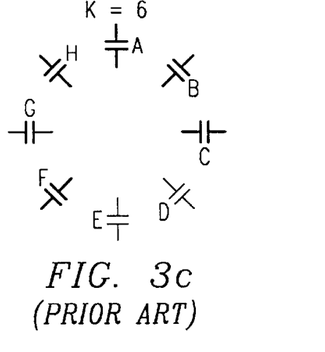

Various DEM algorithms have been proposed to date to either randomize or shape the errors caused by the unit elements within the multi-bit DAC. Known available DEM algorithms have significant disadvantages in terms of performance as well as complexity. The most widely used DEM algorithm, data-weighted averaging (DWA), provides a good attenuation of DAC noise by ideally achieving a first-order noise shaping. Assuming the 3-bit DAC is implemented using 8 unit element capacitors, the operation of the DWA algorithm can be explained using FIGS. 3a, 3b and 3c. As shown, an input sequence of 2, 4, and 6 provides the starting points of the selected unit elements: A, G and C; wherein, the starting point is incremented based upon the input sequence. This ensures maximum usage of each unit element in an effort to average out each individual error associated with each unit element and, thus, provide a first order shaping of the noise associated with the multi-bit DAC. In this manner, the unit elements of the data converter may equally participate in the conversion process, thereby minimizing the effects of mismatched elements in a data converter by distributing errors due to mismatched elements.

Figure 4A:
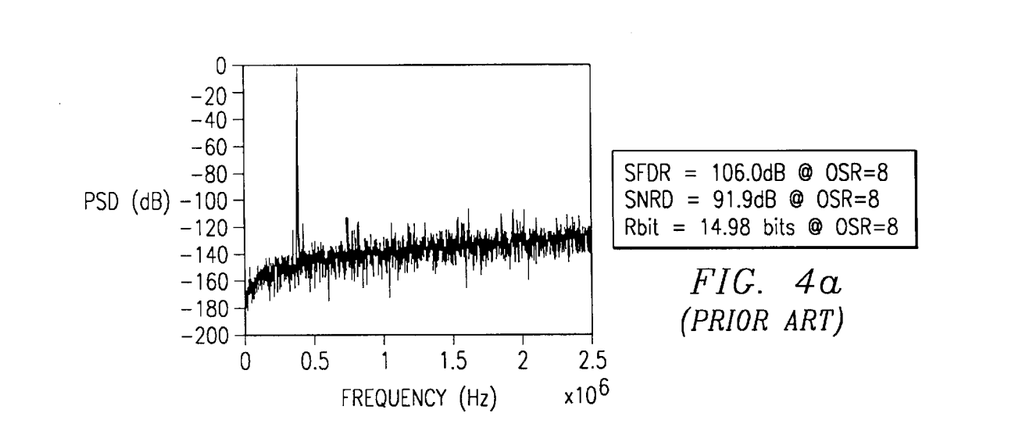
FIGS. 4a and 4b display the in-band spectrum of the output of the SDM having a DWA DEM for input signals of −4 db and −25 dB, respectively.
Figure 4B:
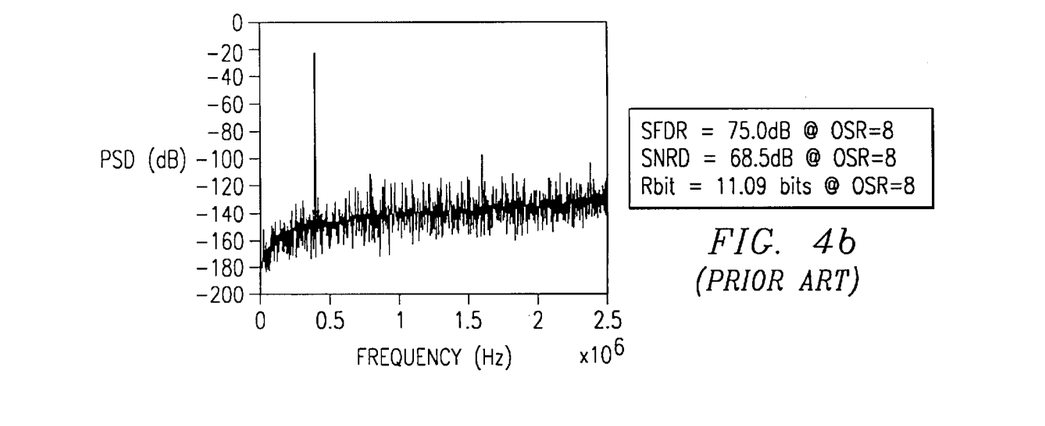

Since the pointer increment is dependent upon input data, the DWA algorithm is dependent upon the amplitude and frequency of the input signal. As such, the conventional DWA algorithm produces in-band tones for smaller input amplitudes, which reduces the SFDR drastically as is shown by comparison of the in-band spectrum representations of the SDM output as shown in FIGS. 4a and 4b, wherein the input signals are −4 dB and −25 dB, respectively. As shown, the amplitude and location of the in-band tones depends upon the input signal amplitude. Some of the tones appear as harmonics, thereby, reducing total harmonic distortion (THD) as well.

Furthermore, the DWA algorithm can cause folding of DAC out-of-band tones into the baseband which results in the reduction of SDM performance, reducing the SFDR drastically, particularly in modulators having a reduced over-sampling ratio. These tones, depending upon the input signal amplitude, move around within the input bandwidth. Many versions of DWA have been proposed in an attempt to eliminate these in-band tones resulting from the DWA algorithm. In a first approach, DWA aliasing tones in a multi-bit SDM can be broken up and randomized by adding dither, at the cost of increasing baseband noise, reducing dynamic range, and possibly destabilizing the modulator.

U.S. Pat. No. 6,218,977, incorporated herein by reference, discloses a method and apparatus for distributing mismatched error associated with data converter elements using a rotator circuit. The rotator circuit includes a barrel shifter coupled to receive the digital output to shift the output by an amount determined by an encoder pointed to a table look-up value which supplies the appropriate clocked delay to the barrel shifter. This output is fed back into the DAC for conversion and summation with the input signal to cancel the effects of the error in the unit elements of the DAC. This approach, however, implements the conventional DWA algorithm which produces in-band tones for smaller input amplitudes, and, thus, substantially reduces the SFDR.

Other approaches include: rotated DWA, extra unit element DWA, Offset DWA, randomized DWA (RnDWA), Bi-DWA, and partitioned DWA. All of these solutions, however, either increase complexity or reduce signal to noise ratio plus distortion (SNRD) or both.

Specifically, the RnDWA as disclosed in "Techniques for Preventing Tonal Behavior of Data Weighted Averaging Algorithm in Sigma-Delta Modulators," Morteza Vadipour, *IEEE Transactions On Circuits and Systems—II: Analog and Digital Signal Processing*, Vol. 47, No. 11, November 2000, (which is incorporated by reference herein) is implemented in such a way that no unit is reselected before all the other units are reselected. Each selection is random in nature and is dependent upon every element being selected once prior to reselection of an element. This ensures that the sum of errors remains small and random, assuming that the DAC is offset free and gain is ideal. Although the RnDWA implementation as disclosed in the Vadipour paper improves the SFDR of a signal, the SNRD will decrease which is not desirable. The RnDWA is also complex to implement; and, thus, is not a cost effective solution.

Thus, a need exists for a multi-bit SDM incorporating a dynamic element matching algorithm that gives a first order noise shaping of errors associated with the unit elements of the multi-bit DAC, without creating large in-band tones. This multi-bit SDM must drastically reduce in-band tones associated with DWA while maintaining SNRD at high input signal amplitudes.

SUMMARY OF THE INVENTION

To address the above-discussed deficiencies of multi-bit sigma-delta modulators (SDM), the present invention teaches an SDM which gives a first order noise shaping of the errors associated with the multi bit DAC employing unit elements, without creating large in-band tones. The SDM includes a summer connected to an analog loop filter having an inverse noise shaping function which processes the analog input signal. A multi-bit ADC converts the processed signal into a digital output signal. A feedback path, leading from the multi-bit ADC to the summer, includes at least one dynamic element matching algorithm logic block connected to a multi-bit DAC having a plurality of unit elements. The feedback path minimizes mismatch error associated with the plurality of unit elements. The dynamic element matching algorithm logic block alternately generates an incremental shift signal and a random shift signal at a predetermined time interval for shifting the digital feedback signal by a random amount depending upon the amplitude and frequency of the analog input signal to provide a randomized rotated output to the DAC.

The first embodiment of the dynamic element matching algorithm logic block may include a random number generator connected to a first multiplexer input to provide a random number. A latch receives the digital feedback signal and provides this latched signal to an encoder. A signal dependent counter couples to receive the system clock and the digital feedback signal. If the digital feedback signal is within a predetermined range, a control signal will be generated at a predetermined interval to control the multiplexer. When the control signal is generated at this predetermined interval, the multiplexer provides the random number at its output. At all other cycles, the multiplexer provides the encoded signal at its output. A summer connects between the multiplexer and a decoder to receive this multiplexed output. A feedback delay loop connects from the summer output to the summer input to add a predetermined delay value to the multiplexed output. The decoded signal serves as a shift signal to be applied to a barrel shifter. The barrel shifter includes shifting units that form a shifting column. The first input of the shifting units couples to receive a single bit of the digital feedback signal. The second input of the shifting units connects to the first input of another one of the shifting units. A select line connects to the decoder to apply the shift signal to the shifting units effectuating a shift of the digital feedback signal received by the first input to produce a randomized rotated output.

In the alternative, the random shift signal used to produce a randomized rotated output may depend from a probability variable supplied by a storage unit. As such, a second embodiment of the dynamic element matching algorithm logic block may include a random number generator connected to a first multiplexer input. A latch receives the digital feedback signal and provides this latched signal to an encoder. A storage device having a table of probability variables, clocked by the system clock, provides an input to a comparator. The random number generator provides a first random number to the comparator. The comparator compares the first random number with the probability variable provided by the storage device. The random number generator provides a second random number to the multiplexer. If the first random number is less than the probability variable, then a control pulse is provided to the multiplexer such that a second random number generated by the random number generator appears at the multiplexer output. If the first random number is greater than or equal to the probability variable, then a control pulse is provided to the multiplexer such that the encoded signal appears at the multiplexer output. A summer connects between the multiplexer and a decoder to receive this multiplexed output. A feedback delay loop connects from the summer output to the summer input to add a predetermined delay value to the multiplexed output. The decoded signal serves as a shift signal to be applied to a barrel shifter. The barrel shifter includes shifting units that form a shifting column. The first input of the shifting units couples to receive a single bit of the digital feedback signal. The second input of the shifting units connects to the first input of another one of the shifting units. A select line connects to the decoder to apply the shift signal to the shifting units effectuating a shift of the digital feedback signal received by the first input to produce a randomized rotated output.

Advantages of this design include but are not limited to an SDM having the innovative dynamic element matching algorithm logic block that gives a first order noise shaping of the errors associated with the multi bit DAC employing unit elements, without creating large in-band tones. The dynamic element matching algorithm logic block disclosed achieves drastic reduction of in-band tones in DWA while maintaining SNRD at higher signal amplitudes.

Although the first embodiment and second embodiments are described in the context of a DAC, the teachings of the present invention may also be applied to ADC's and any other application where dynamic element matching is deemed necessary.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

Figure 5:
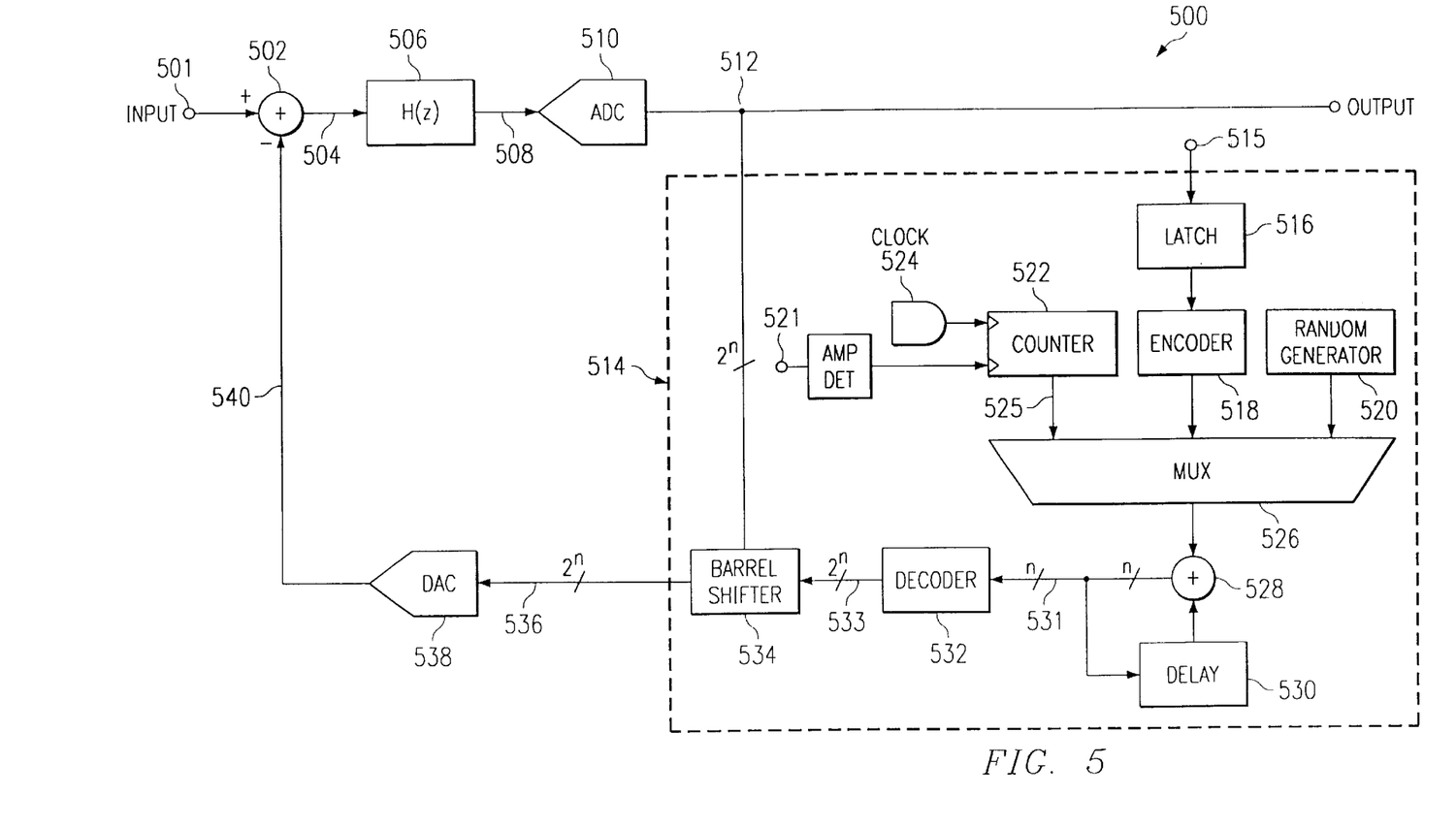
FIG. 5 displays a first embodiment of a multi-bit SDM having dynamic element matching algorithm logic block in accordance with the present invention.

Referring to FIG. 5, a sigma-delta modulation (SDM) circuit 500 in accordance with the present invention of a preferred embodiment provides a first order noise shaping of the errors associated with the multi bit DAC employing unit elements, without creating large in-band tones. SDM circuit 500 includes a summing junction 502, a filter 506, a multi-bit ADC 510, dynamic element matching algorithm logic block 514, and a multi-bit DAC 538.

More particularly, filter 506 suitably performs an inverse noise shaping function on input analog signal 501, whereupon the processed signal 508 is applied to ADC 510 which is an N-level multi-bit data converter. In order to compensate for quantization noise imparted to the signal by ADC 510, the output signal 512 is fed back to summing junction 502, wherein the quantization noise is suitably noise shaped out of the analog signal band. The unit elements (e.g., capacitors, resistors, current sources, and the like) of the DAC 538, however, may not necessarily be perfectly matched. Consequently, these unit elements may impart an error to the analog signal 540 produced by the DAC 538 and fed to the summing junction 502.

Thus, SDM circuit 500 includes within the feedback path, leading from the multi-bit ADC 510 to summing junction 502, at least one dynamic element matching algorithm logic block 514 connected to the multi-bit DAC 538 having a plurality of unit elements. The feedback path minimizes mismatch error associated with the plurality of unit elements. The dynamic element matching algorithm logic block 514 alternately generates an incremental shift signal and a random shift signal at a predetermined time interval for shifting the digital feedback signal by some random amount depending upon the amplitude and frequency of the analog input signal 504 to provide a randomized rotated output 536 for DAC 538.

The dynamic element matching algorithm logic block 514 is employed to randomly rotate the output signal 512 at predetermined time intervals, such that a randomized rotated output 536 of the output signal 512 is applied to the DAC 538. In this way, the error associated with the mismatched unit elements may be effectively noise shaped by implementing a suitable noise shaping function (e.g. a first order noise shaping function) as a consequence of a suitable algorithm (e.g., adaptively randomized DWA) for manipulating the unit elements. In order to provide this function, the first embodiment of the dynamic element matching algorithm logic block 514 may suitably be configured to include a barrel shifter 534, a latch 516, an encoder 518, a random number generator 520, clock 524, a signal dependent counter 522, an amplitude detector 523, a multiplexer 526, a summing junction 528, a delay 530, and a decoder 532.

Subsequent processing of output signal 512 may produce, for example, an encoded output signal of n-bits corresponding to a desired characteristic (e.g., magnitude) of output signal 512. Furthermore, the output signal 512 is suitably fed to the dynamic element matching algorithm logic block 514 such that the circuit block 514 converts the signal 512 to the randomized rotated output 536 that is provided to the DAC 538.

As shown, output signal 512 from the ADC 510 is supplied to shifter 534. Latch 516 may couple to receive the input analog signal 501 or digital feedback signal 512 or any other filtered version of the input analog signal 501. Encoder 518 connects to latch 516 to receive this latched signal. Signal dependent counter 522 couples to receive the system clock from clock 524 to provide a predetermined output control signal 525. An amplitude detector 523 may receive an input 521 from input analog signal 501 or digital feedback signal 512 or any other filtered and possibly digitized version of the input analog signal 501. The random number generator 520 connected to a first input of multiplexer 526 provides a random number. Accordingly, if the amplitude of the input signal 501 is within a predetermined range, a control signal 525 will be generated at a predetermined interval and provided to control multiplexer 526. When control signal 525 is generated at this predetermined interval, multiplexer 526 provides the random number generated by random number generator 520 at its output. At all other cycles, multiplexer 526 provides the encoded signal generated by encoder 518 at the multiplexer 526 output.

Specifically, the predetermined range may be defined as the input amplitude range where SDM circuit 500 is split into M corresponding subsections of this input amplitude range, where M=1, 2, ... etc. Each subsection M incorporates a corresponding randomization interval $(r_1, r_2 \ldots r_M)$. These predetermined values of subsections M and randomization intervals $(r_1, r_2 \ldots r_M)$ may be determined by monitoring the maximum amplitude of the analog input signal 501 for a predetermined period of time such that signal dependent counter 522 is preprogrammed with these variables in an effort to calculate control signal 525. Thus, in one implementation, the randomization interval of control signal 525 may be a multiple of the input sampling clock, having period of $2^r/F_s$, where r is a randomization interval $(r_1, r_2 \ldots r_M)$ and $F_s$ is the sampling frequency.

The randomization interval $(r_1, r_2 \ldots r_M)$ is defined as the interval in which the pointer of DAC 538 is shifted by a random number. In operation, the pointer of the unit element DAC 538 is incremented using the input sequence consecutively in every cycle. Once every randomization interval, however, the pointer is reset to a random number. In one implementation, the randomization interval may be varied adaptively based upon the input signal amplitude.

Since the appearance of in-band tones using known DWA algorithms arises at small input amplitudes appearing as noise and harmonics in the output signal, the incorporation of an adaptively randomizable DWA algorithm avoids the periodicities at smaller amplitudes; and, thus, minimizes in-band tones in the SDM circuit output signal. The amount of randomization needed to eliminate the periodicities depends on the input amplitude. Thus, amplitude dependent randomization is implemented in the SDM circuit 500 in accordance with the present invention.

Each randomization interval $(r_1, r_2 \ldots r_M)$ at each amplitude range section can be varied to adjust the amount of randomness. As r approaches 0, circuit block 514 provides a continuously random pointer value 536. As r approaches ∞, however, no randomization exists. Thereby, circuit block 514 performs the known DWA algorithm merely providing a rotated output 536 leading to in-band tones in the output signal 512. Thus, it is necessary to select appropriate values of each randomization interval $(r_1, r_2 \ldots r_M)$ to optimize either the SNRD or SFDR. Accordingly, if the SNRD is important characteristic, each randomization interval $(r_1, r_2 \ldots r_M)$ can be set to large value. Alternately, if the SFDR is important characteristic, each randomization interval $(r_1, r_2 \ldots r_M)$ can be set to small value.

Summing junction 528 connects between multiplexer 526 and decoder 532 to receive the multiplexed output. A feedback delay loop between summing junction 528 and decoder 532 adds a predetermined delay value to the multiplexed output using delay element 530. The decoded signal 533 serves as a shift signal to be applied to a barrel shifter 534. Barrel shifter 534 includes shifting units that form a shifting column. The first input of the shifting units couples to receive a single bit of the digital feedback signal 512. The second input of the shifting units connects to the first input of another one of the shifting units. A select line connects to the decoder 532 to apply the shift signal 533 to the shifting units effectuating a shift of the digital feedback signal 512 received by the first input to produce a randomized rotated output 536.

In this way, the DEM logic block 514 may randomly manipulate (e.g., rotate) the output signal 512, to produce a randomized rotated output 536 useful as a pointer or "bookmark" for implementing the Adaptively randomizable DWA for varying the unit elements within the DAC 538.

Advantages of this design include but are not limited to a multi-stage sigma delta modulator having a high performance, simple, and cost effective design. The SDM circuit 500, described herein, having the adaptively randomizable DEM algorithm is superior to other known algorithms since it substantially reduces the in-band tones for all signal amplitudes. Moreover, unlike other known algorithms, the process of SDM circuit 500 does not trade off the peak SNRD resulting from the implementation of data weighted averaging in an effort to reduce the in-band tones.

Figure 6:
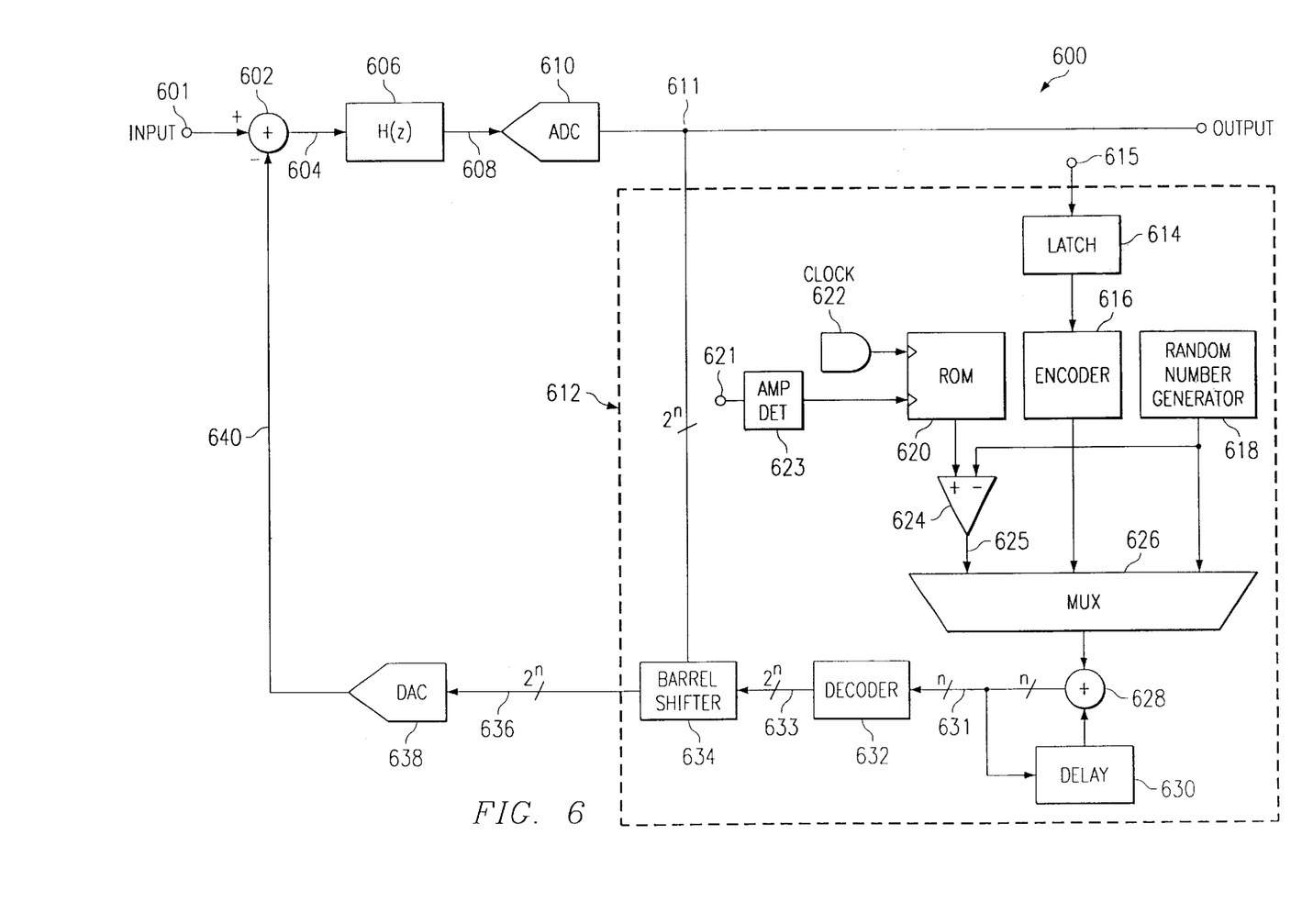
FIG. 6 shows a second embodiment of a multi-bit SDM having dynamic element matching algorithm logic block in accordance with the present invention.

Referring to FIG. 6, a second embodiment of a SDM circuit 600 having a dynamic element matching algorithm logic block in accordance with the present invention is shown. SDM circuit 600 as includes a summing junction 602, a filter 606, an ADC 610, dynamic element matching algorithm logic block 612, and a DAC 638.

As discussed regarding the first embodiment of SDM circuit 500, filter 606 suitably performs an inverse noise shaping function on input analog signal 601, whereupon the processed signal 608 is applied to ADC 610, which is an N-level multi-bit data converter. In order to compensate for quantization noise imparted to the signal by ADC 610, the output signal 611 is fed back to summing junction 602, wherein the quantization noise is suitably noise shaped out of the analog signal band. The unit elements (e.g., capacitors, resistors, current sources, and the like) of the DAC 638, however may not necessarily be perfectly matched. Consequently, these unit elements may impart an error to the analog signal 640 produced by the DAC 638 and fed to the summing junction 602.

Thus, SDM circuit 600 includes within the feedback path, leading from the multi-bit ADC 610 to summing junction 602, at least one dynamic element matching algorithm logic block 612 connected to the multi-bit DAC 638 having a plurality of unit elements. The feedback path minimizes mismatch error associated with the plurality of unit elements. The dynamic element matching algorithm logic block 612 alternately generates an incremental shift signal and a random shift signal at a random time interval for shifting the digital feedback signal by some random amount depending upon probability variables stored within the storage device 620 to produce a randomized rotated output 636 for DAC 638.

The dynamic element matching algorithm logic block 612 is employed to randomly rotate the output signal 611 at random time intervals, such that a randomized rotated output 636 of the output signal 611 is applied to the DAC 638. In this way, the error associated with the mismatched unit elements may be effectively noise shaped by implementing a suitable noise shaping function (e.g. a first order noise shaping function) as a consequence of a suitable algorithm (e.g., adaptively randomized DWA) for manipulating the unit elements. In order to provide this function, the second embodiment of the dynamic element matching algorithm logic block 612 may suitably be configured to include a barrel shifter 634, a latch 614, an encoder 616, a random number generator 618, clock 622, a storage device 620, an amplitude detector 623, a comparator 624, a multiplexer 526, a summing junction 628, a delay 630 and a decoder 632.

Subsequent processing of output signal 611 may produce, for example, an encoded output signal of n-bits corresponding to a desired characteristic (e.g., magnitude) of output signal 611. Furthermore, the output signal 611 is suitably fed to the dynamic element matching algorithm logic block 612 such that the circuit block 612 converts the signal 611 to the randomized rotated output 636 that is provided to the DAC 638.

As shown, output signal 611 from the ADC 610 is supplied to shifter 634. Latch 614 receives may couple to receive the input analog signal 601 or digital feedback signal 611 or any other filtered version of the input analog signal 601. Storage device 620 couples to receive the system clock from clock 622 to provide a predetermined output control signal 625. Storage device 620 includes a table of probability variables which are selected based upon the system clock 622 and the amplitude of input signal 601. An amplitude detector 623 may receive an input 621 from input analog signal 601 or digital feedback signal 611 or any other filtered and possibly digitized version of the input analog signal 601. A probability variable is provided to comparator 624 based upon the amplitude of the input signal supplied at input 621. Random number generator 618 provides a first random number to the comparator 624. Comparator 624 compares the first random number with the probability variable provided by the storage device 620. In addition, random number generator 618 provides a second random number at an input of the multiplexer 626. If the first random number is less than the probability variable, then a control pulse 625 is provided to control multiplexer 626 such that the second random number is presented at the output of multiplexer 626. If the first random number is greater than or equal to the probability variable, then a control pulse 625 is provided to multiplexer 626 such that the encoded signal from encoder 616 is produced at the output of multiplexer 626.

Summing junction 628 connects between multiplexer 626 and decoder 632 to receive the multiplexed output. A feedback delay loop between summing junction 628 and decoder 632 adds a predetermined delay value to the multiplexed output using delay element 630. The decoded signal 633 serves as a shift signal to be applied to a barrel shifter 634. Barrel shifter 634 includes shifting units that form a shifting column. The first input of the shifting units couples to receive a single bit of the digital feedback signal 611. The second input of the shifting units connects to the first input of another one of the shifting units. A select line connects to the decoder 632 to apply the shift signal 633 to the shifting units effectuating a shift of the digital feedback signal 611 received by the first input to produce a randomized rotated output 636. Thus, the DEM logic block 612 manipulates (e.g., rotate) output signal 611, to produce a randomized rotated output 636 useful as a pointer or "bookmark" for implementing the adaptively randomizable DWA for varying the unit elements within the DAC 638.

Figure 7A:
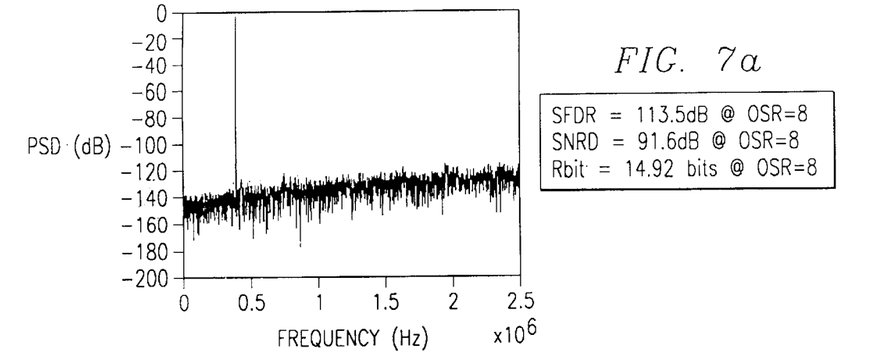
FIGS. 7a and 7b illustrate the in-band spectrum of the output of the SDM having a DWA DEM in accordance with the present invention for input signals of −4 db and −25 dB, respectively.
Figure 7B:
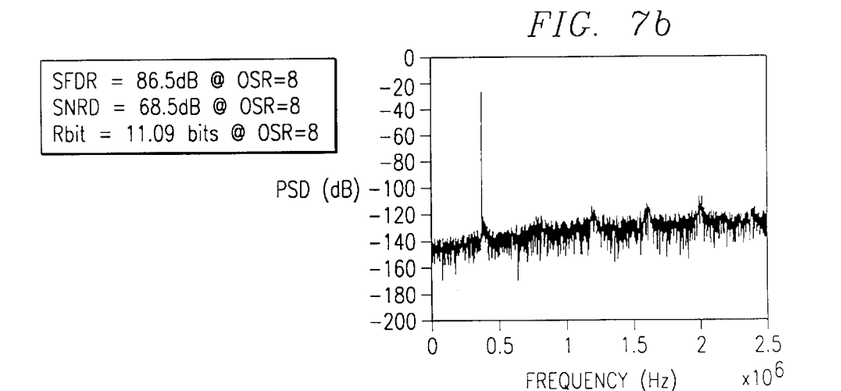

FIGS. 7*a* and 7*b* displays the in-band spectrum of the output of the SDM circuit 500 of FIG. 5 with corresponding input amplitudes of −4 dB and −25 dB, respectively. Simulations were conducted for a 2-1-1 MASH modulator having a 3-bit DAC in the first stage, where the predetermined range variable M is 2 and randomization intervals, $r_1$ and $r_2$ are 10 and 7, respectively. The unit element error distribution was assumed to be Gaussian with a sigma value of 0.001. Comparing FIGS. 7*a* and 7*b* to FIGS. 4*a* and 4*b*, the SNRD of the SDM circuit 500 is maintained, the in-band tones are reduced and the SFDR increases substantially.

Figure 8A:
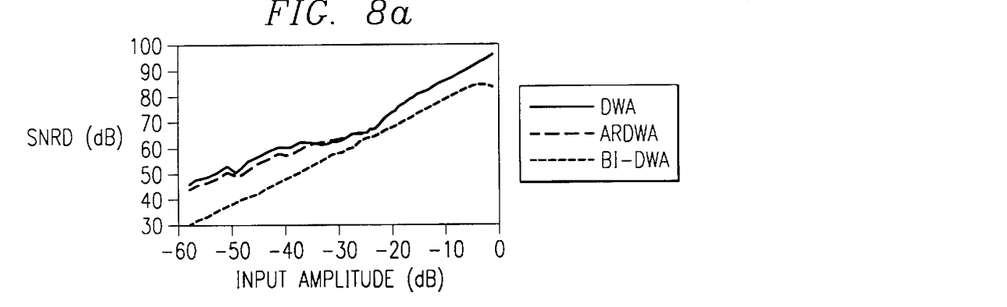
FIG. 8a displays the SNRD for a conventional DWA algorithm, a Bi-DWA algorithm, and the Adaptively Randomizable Algorithm in accordance with the present invention.
Figure 8B:
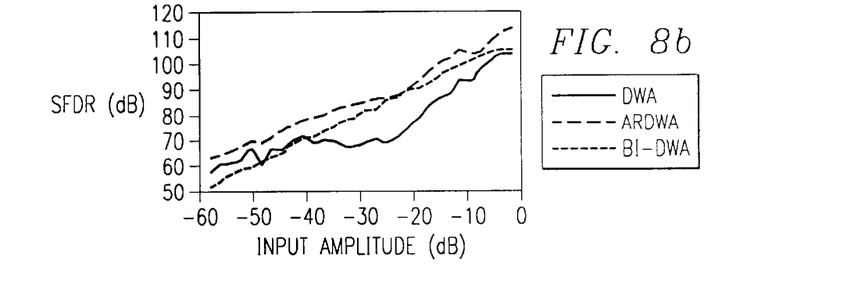
FIG. 8b displays the SFDR for a conventional DWA algorithm, a Bi-DWA algorithm, and the Adaptively Randomizable Algorithm in accordance with the present invention. TI-35013

Known DWA and Bi-DWA algorithms were simulated for comparison with the adaptively randomizable DWA. The results are displayed in FIGS. 8*a* and 8*b* which shows the input amplitude versus the SNRD and the SFDR, respectively. FIG. 8*a* illustrates that the Bi-DWA algorithm reduces the SNRD drastically throughout the amplitude range. The adaptively randomizable DWA in accordance with the present invention, however, maintains or improves the SNRD for amplitudes through −35 dB. FIG. 8*b* shows that the worst spur is at substantially disadvantage using the DWA algorithm for amplitudes within the range of −10 to −40 dB. The adaptively randomizable DWA in accordance with the present invention, however, substantially improves the SFDR through the amplitude range due to the suppression of in-band tones. In addition, the SFDR of the adaptively randomizable DWA in accordance with the present invention is higher than that of the Bi-DWA algorithm for a substantial portion of the range of the input signal amplitude.

Those of skill in the art will recognize that the physical location of the elements illustrated in FIGS. 5 and 6 can be moved or relocated while retaining the function as described above. Moreover, those skilled in the art will recognize that the adaptively randomizable method of selecting the unit elements of the DAC wherein consecutive increment shift signals and random shift signal at a predetermined or a random time interval depending upon the amplitude and frequency of the analog input signal may be applied to other DEM algorithmic implementations, such as group level averaging (GLA) and individual level averaging (ILA), where one or more pointers or rotating pointers are incorporated within the architecture.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A dynamic element matching circuit, comprising:
   a random number generator to generate a random number;
   a latch coupled to receive an input signal;
   an encoder coupled to the latch to provide an encoded digital signal;
   an amplitude detector coupled to receive the input signal to detect the amplitude of the input signal;

at least one signal dependent counter coupled to the amplitude detector to generate a control signal, the signal dependent counter coupled to receive a system clock, such that if the input signal is within one of a plurality of predetermined ranges, the control signal will be generated at a respective predetermined time interval;

at least one first multiplexer having a first and second input, a control input, and an output, the first and second inputs coupled to receive the encoded digital signal and the random number, the control input coupled to receive the control signal to control when the encoded digital signal is provided at the output of the first multiplexer and the random number is provided at the output of the first multiplexer;

at least one summer having a first and second input and an output, the first input coupled to the output of the first multiplexer;

at least one delay coupled between the output of the summer and the second input of the summer to provide feedback and a shift signal;

a decoder coupled to the at least one delay to decode the shift signal; and a barrel shifter that comprises,
  a plurality of shifting units forming a shifting column, the shifting column configured to receive the digital feedback signal,
  a first input for each of the plurality of shifting units, the first input receiving a single bit of the digital feedback signal,
  a second input for each of the plurality of shifting units, the second input connected to the first input of another one of the plurality of shifting units, and
  a select line coupled to the decoder to apply the shift signal to the plurality of shifting units effectuating a shift of the digital feedback signal received by the first input to produce a randomized rotated output.

2. A sigma-delta modulator, comprising:

a summer coupled to receive an analog input signal;

a analog loop filter having a noise shaping function coupled to receive the output of the summer;

an analog-to-digital converter coupled to receive the filtered signal to convert the signal to a digital output signal; and a feedback path from the analog-to-digital converter to the summer, the feedback path comprising at least one dynamic element matching algorithm logic block coupled to a digital-to-analog converter having a plurality of unit elements to minimize the mismatch error associated with the plurality of unit elements, wherein the dynamic element matching algorithm logic block alternately generates an incremental shift signal and a random shift signal at a predetermined time interval for shifting the digital feedback signal by a random amount depending upon the amplitude and frequency of the analog input signal to provide a randomized rotated output.

3. A sigma-delta modulator as recited in claim 2, wherein the analog-to-digital converter is a multi-bit analog-to-digital converter, comprising:

a plurality of comparators coupled to receive an analog input; and a voltage divider network having a plurality of outputs coupled to the reference voltage to provide an incrementally higher voltage level associated with the reference voltage at each output, the plurality of outputs coupled to the plurality of comparators respectively, such that each comparator compares the analog input with the incrementally higher voltage level associated with the plurality of outputs to provide a digital signal.

4. A sigma-delta modulator as recited in claim 2, wherein the digital-to-analog converter is a multi-bit digital-to-analog converter, comprising:

the plurality of unit elements coupled to receive the randomized rotated output having a bit-width, wherein the number of unit elements is equivalent to the bit-width; and a comparator coupled to receive the voltage charge from the plurality of unit elements to generate an analog feedback signal.

5. A sigma-delta modulator as recited in claim 4, wherein each of the plurality of unit elements is a capacitor.

6. A sigma-delta modulator as recited in claim 4, wherein each of the plurality of unit elements is a resistor.

7. A sigma-delta modulator as recited in claim 4, wherein each of the plurality of unit elements is a current source.

8. A sigma-delta modulator as recited in claim 2, wherein the algorithm logic block comprises:

a random number generator to generate a random number;

a latch coupled to receive an input signal;

an encoder coupled to the latch to provide an encoded digital signal;

an amplitude detector coupled to receive the input signal to detect the amplitude of the input signal;

a signal dependent counter coupled to the amplitude detector to generate a control signal, the signal dependent counter coupled to receive a system clock, such that if the input signal is within one of a plurality of predetermined ranges, the control signal will be generated at a respective predetermined time interval;

a multiplexer having a first and second input, a control input, and an output, the first and second inputs coupled to receive the encoded digital signal and the random number, the control input coupled to receive the control signal to control when the encoded digital signal is provided at the output of the multiplexer and the random number is provided at the output of the multiplexer;

a second summer having a first and second input and an output, the first input coupled to the output of the multiplexer;

a delay coupled between the output of the second summer and the second input of the second summer to provide feedback;

a decoder coupled to the output of the second summer to decode the sum of the second summer to provide a shift signal; and a barrel shifter that comprises,
  a plurality of shifting units forming a shifting column, the shifting column configured to receive the digital feedback signal,
  a first input for each of the plurality of shifting units, the first input receiving a single bit of the digital feedback signal,
  a second input for each of the plurality of shifting units, the second input connected to the first input of another one of the plurality of shifting units, and
  a select line coupled to the decoder to apply the shift signal to the plurality of shifting units effectuating a shift of the digital feedback signal received by the first input to produce a randomized rotated output.

9. A dynamic element matching circuit, comprising:
a random number generator to generate a first and a second random number;
a latch coupled to receive an analog input signal;
an encoder coupled to the latch to provide an encoded digital signal;
an amplitude detector coupled to receive the input signal to detect the amplitude of the input signal;
at least one storage device having a table of probability variables, the storage device coupled to the amplitude detector and coupled to receive a system clock;
at least one comparator coupled to receive one of the probability variables from the storage device and the first random number to produce a control signal;
at least one first multiplexer having a first and second input, a control input, and an output, the first and second inputs coupled to receive the encoded digital signal and the second random number, the control input coupled to receive the control signal such that when the first random number is less than the probability variable, the second random number is provided at the output of the first multiplexer and when the first random number is greater than or equal to the probability variable, the encoded digital signal is provided at the output of the first multiplexer;
at least one summer having a first and second input and an output to provide a shift signal, the first input coupled to the output of the first multiplexer;
at least one delay coupled between the output of the summer and the second input of the summer to provide feedback;
a decoder coupled to the at least one summer to decode the shift signal; and
a barrel shifter comprises,
    a plurality of shifting units forming a shifting column, the shifting column configured to receive the digital feedback signal,
    a first input for each of the plurality of shifting units, the first input receiving a single bit of the digital feedback signal,
    a second input for each of the plurality of shifting units, the second input connected to the first input of another one of the plurality of shifting units, and
    a select line coupled to the decoder to apply the shift signal to the plurality of shifting units effectuating a shift of the digital feedback signal received by the first input to produce a randomized rotated output.

10. A sigma-delta modulator, comprising:
a summer coupled to receive an analog input signal;
a analog loop filter having a noise shaping function coupled to receive the output of the summer;
an analog-to-digital converter coupled to receive the filtered signal to convert the signal to a digital output signal; and
a feedback path from the analog-to-digital converter to the summer, the feedback path comprising at least one dynamic element matching algorithm logic block coupled to a digital-to-analog converter having a plurality of unit elements to minimize the mismatch error associated with the plurality of unit elements to generate a digital feedback signal, wherein the dynamic element matching algorithm logic block alternately generates an incremental shift signal and a random shift signal at a random time interval for shifting the digital feedback signal by a random amount depending upon a probability variable to provide a randomized rotated output.

11. A sigma-delta modulator as recited in claim 10, wherein the analog-to-digital converter is a multi-bit analog-to-digital converter, comprising:
a plurality of comparators coupled to receive an analog input; and
a voltage divider network having a plurality of outputs coupled to the reference voltage to provide an incrementally higher voltage level associated with the reference voltage at each output, the plurality of outputs coupled to the plurality of comparators respectively, such that each comparator compares the analog input with the incrementally higher voltage level associated with the plurality of outputs to provide a digital signal.

12. A sigma-delta modulator as recited in claim 10, wherein the digital-to-analog converter is a multi-bit digital-to-analog converter, comprising:
the plurality of unit elements coupled to receive the randomized rotated output having a bit-width, wherein the number of unit elements is equivalent to the bit-width; and
a comparator coupled to receive the voltage charge from the plurality of unit elements to generate an analog feedback signal.

13. A sigma-delta modulator as recited in claim 12, wherein each of the plurality of unit elements is a capacitor.

14. A sigma-delta modulator as recited in claim 12, wherein each of the plurality of unit elements is a resistor.

15. A sigma-delta modulator as recited in claim 12, wherein each of the plurality of unit elements is a current source.

16. A sigma-delta modulator as recited in claim 10, wherein the algorithm logic block comprises:
a random number generator to generate a first and a second random number;
a latch coupled to receive an analog input signal;
an encoder coupled to the latch to provide an encoded digital signal;
an amplitude detector coupled to receive the input signal to detect the amplitude of the input signal;
a storage device having a table of probability variables, the storage device coupled to the amplitude detector and coupled to receive a system clock;
a comparator coupled to receive one of the probability variables from the storage device and the first random number to produce a control signal;
a multiplexer having a first and second input, a control input, and an output, the first and second inputs coupled to receive the encoded digital signal and the second random number, the control input coupled to receive the control signal such that when the first random number is less than the probability variable, the second random number is provided at the output of the multiplexer and when the first random number is greater than and equal to the probability variable, the encoded digital signal is provided at the output of the multiplexer;
a second summer having a first and second input and an output, the first input coupled to the output of the multiplexer;
a delay coupled between the output of the second summer and the second input of the second summer to provide feedback;

a decoder coupled to the output of the second summer to decode the sum of the second summer to produce a shift signal; and a barrel shifter comprises,
- a plurality of shifting units forming a shifting column, the shifting column configured to receive the digital feedback signal,
- a first input for each of the plurality of shifting units, the first input receiving a single bit of the digital feedback signal,
- a second input for each of the plurality of shifting units, the second input connected to the first input of another one of the plurality of shifting units, and
- a select line coupled to the decoder to apply the shift signal to the plurality of shifting units effectuating a shift of the digital feedback signal received by the first input to produce a randomized rotated output.

17. A method of distributing mismatched error associated with a plurality of data converter elements, comprising the steps of:
   a. filtering an analog input signal using a filter configured to perform a noise shaping function on the analog input signal and to generate a processed signal;
   b. converting the processed signal into a digital output signal using an analog-to-digital converter;
   c. feeding back the digital output signal to a dynamic element matching logic block to alternately shift the digital feedback signal incrementally and randomly at a predetermined time interval by a random amount depending upon the amplitude and frequency of the analog input signal to generate a randomized rotated output;
   e. converting the randomized rotated output into an analog feedback signal;
   f. summing the analog feedback signal with the input analog signal to provide a modified analog input signal to minimize the error associated with the plurality of data converter elements; and
   g. repeating steps a through f.

18. The method of claim 17 wherein, the dynamic element matching step includes:
   a. generating a random number using a random number generator;
   b. supplying the analog input signal into a latch;
   c. encoding the analog input signal to generate an encoded signal;
   d. detecting the amplitude of the analog input signal by an amplitude detector;
   e. generating a control signal using a signal dependent counter clocked by a system clock coupled to the amplitude detector such that if the amplitude of tine analog input signal is within a predetermined range, the control signal is generated at a predetermined time interval;
   f. supplying the control signal to a multiplexer;
   g. supplying either the encoded digital signal or the random number at the output of the multiplexer depending upon the control signal;
   h. adding a feedback time delay to the signal at the output of the multiplexer;
   i. decoding the sum using a decoder; and
   j. shifting the digital feedback signal by the decoded multiplexed signal to provide the randomized rotated output.

19. A method of distributing mismatched error associated with a plurality of data converter elements, comprising the steps of:
   a. filtering an analog input signal using a filter configured to perform a noise shaping function on the analog input signal and to generate a processed signal;
   b. converting the processed signal into a digital output signal using an analog-to-digital converter;
   c. feeding back the digital output signal to a dynamic element matching logic block to alternately shift the digital feedback signal incrementally and randomly at a random time interval by a random amount depending upon a probability variable to generate a randomized rotated output;
   e. converting the randomized rotated output into an analog feedback signal;
   f. summing the analog feedback signal with the input analog signal to provide a modified analog input signal to minimize the error associated with the plurality of data converter elements;
   g. repeating steps a through f.

20. The method of claim 19 wherein, the dynamic element matching step includes:
   a. generating a first and second random number by a random number generator;
   b. supplying the analog input signal into a latch;
   c. encoding the analog input signal to generate an encoded signal;
   d. detecting the amplitude of the analog input signal by an amplitude detector;
   e. retrieving the probability variable from a storage device coupled to the amplitude detector based upon the amplitude of the analog input signal;
   f. comparing the first random number with the probability variable;
   g. multiplexing the encoded signal and the second random number using a multiplexer such that when the first random number is less than the probability variable, the second random number is provided at the output of the multiplexer and when the first random number is greater than or equal to the probability variable, the encoded digital signal is provided at the output of the multiplexer;
   h. adding a feedback time delay to the signal at the output of the multiplexer;
   i. decoding the sum using a decoder; and
   j. shifting the digital feedback signal by the decoded sum to provide the randomized rotated output.

* * * * *